United States Patent [19]

Rabile

[11] Patent Number: 5,313,300
[45] Date of Patent: May 17, 1994

[54] BINARY TO UNARY DECODER FOR A VIDEO DIGITAL TO ANALOG CONVERTER

[75] Inventor: Robert J. Rabile, West Chester, Pa.

[73] Assignee: Commodore Electronics Limited, Nassau, The Bahamas

[21] Appl. No.: 927,683

[22] Filed: Aug. 10, 1992

[51] Int. Cl.$^5$ .............................................. H04N 5/14
[52] U.S. Cl. ................................. 348/572; 341/144; 341/154
[58] Field of Search ............. 358/160, 21 R; 340/703, 340/793; 341/56, 56, 99, 144, 154; H04N 5/14

[56]  References Cited

U.S. PATENT DOCUMENTS

| | | | |
|---|---|---|---|
| 4,118,699 | 10/1978 | Conner | 341/154 |
| 4,158,200 | 6/1979 | Seitz et al. | 340/750 |
| 4,284,988 | 8/1981 | Seitz et al. | 340/726 |
| 4,318,085 | 3/1982 | Whiteside et al. | 341/154 |
| 4,620,188 | 10/1986 | Sengchanh | 340/825.87 |
| 4,774,495 | 9/1988 | Rafter et al. | 341/144 |
| 5,138,317 | 8/1992 | Story | 341/144 |
| 5,173,697 | 12/1992 | Smith et al. | 341/144 |

OTHER PUBLICATIONS

Sheingold, Analog-Digital Conversion Handbook, 1986, pp. 200-201.

Primary Examiner—James J. Groody
Assistant Examiner—Jeffrey S. Murrell
Attorney, Agent, or Firm—Panitch Schwarze Jacobs & Nadel

[57]  ABSTRACT

A binary to unary decoder for a video digital to analog converter is cascadeable in both a horizontal and a vertical direction. Video data is transmitted from a video data source and received by a plurality of unary decoders which convert the video data to a corresponding number of unary digits having comparable value. The unary decoders are arranged in a number of cascaded levels. A plurality of cascaded unary block drivers receive the unary digits and transit unary output digits to a video data bus. The plurality of unary block drivers are arranged in a number of tiers having a predetermined number of individual unary block drivers. The predetermined number of cascaded unary block drivers are enabled based upon the numerical value of the video data.

8 Claims, 6 Drawing Sheets

6 Bit Binary to Unary Decoder

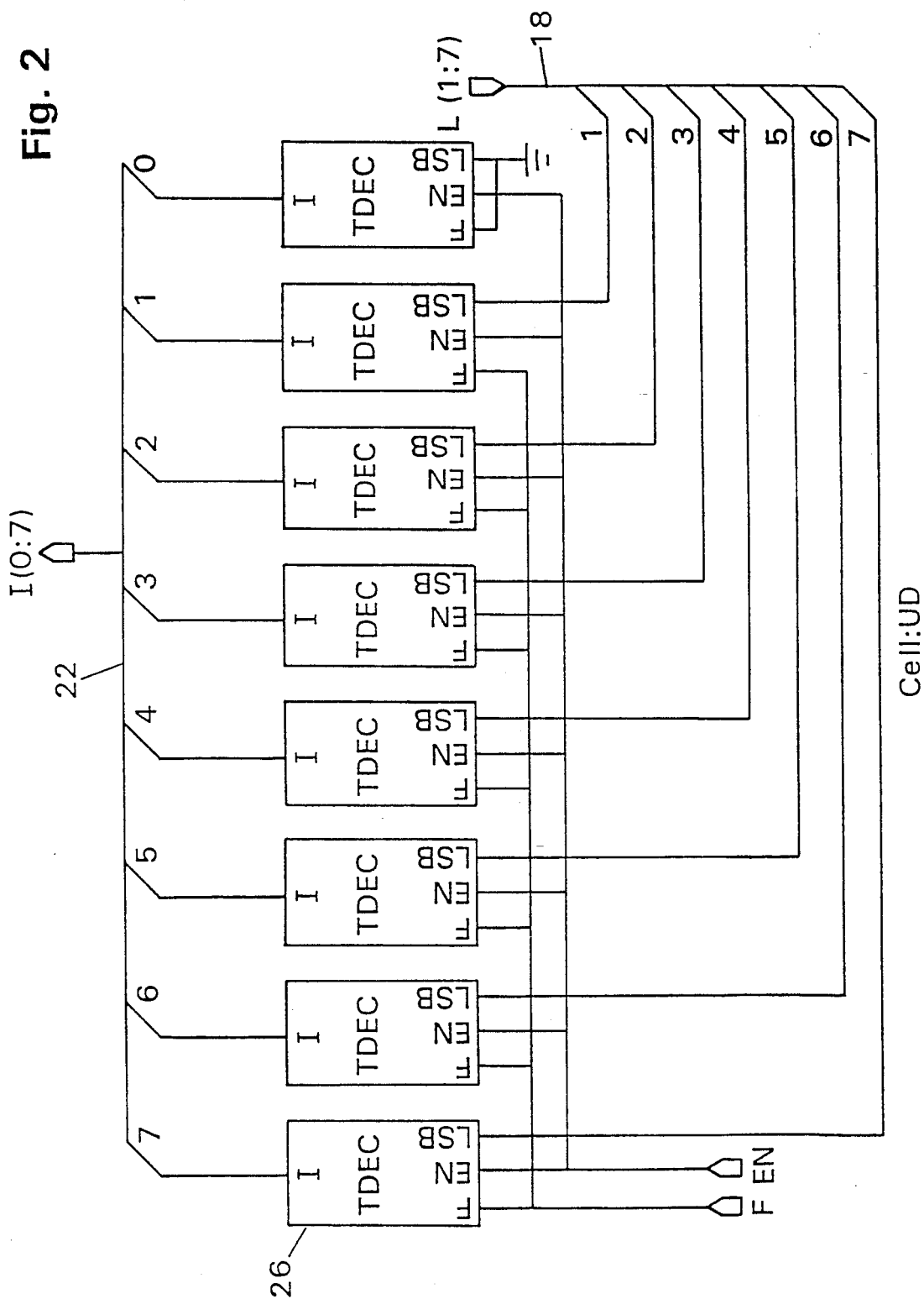

Fig. 4a

Truth Table for 6 Bit DAC

| Input | Output |
|---|---|
| 000000 | 000000000000000000000000000000000000000000000000000000000000000 |
| 000001 | 000000000000000000000000000000000000000000000000000000000000001 |
| 000010 | 000000000000000000000000000000000000000000000000000000000000011 |
| 000011 | 000000000000000000000000000000000000000000000000000000000000111 |
| 000100 | 000000000000000000000000000000000000000000000000000000000001111 |
| 000101 | 000000000000000000000000000000000000000000000000000000000011111 |
| 000110 | 000000000000000000000000000000000000000000000000000000000111111 |
| 000111 | 000000000000000000000000000000000000000000000000000000001111111 |
| 001000 | 000000000000000000000000000000000000000000000000000000011111111 |
| 001001 | 000000000000000000000000000000000000000000000000000000111111111 |
| 001010 | 000000000000000000000000000000000000000000000000000001111111111 |
| 001011 | 000000000000000000000000000000000000000000000000000011111111111 |
| 001100 | 000000000000000000000000000000000000000000000000000111111111111 |
| 001101 | 000000000000000000000000000000000000000000000000001111111111111 |
| 001110 | 000000000000000000000000000000000000000000000000011111111111111 |
| 001111 | 000000000000000000000000000000000000000000000000111111111111111 |
| 010000 | 000000000000000000000000000000000000000000000001111111111111111 |
| 010001 | 000000000000000000000000000000000000000000000011111111111111111 |
| 010010 | 000000000000000000000000000000000000000000000111111111111111111 |
| 010011 | 000000000000000000000000000000000000000000001111111111111111111 |
| 010100 | 000000000000000000000000000000000000000000011111111111111111111 |
| 010101 | 000000000000000000000000000000000000000000111111111111111111111 |
| 010110 | 000000000000000000000000000000000000000001111111111111111111111 |
| 010111 | 000000000000000000000000000000000000000011111111111111111111111 |
| 011000 | 000000000000000000000000000000000000000111111111111111111111111 |
| 011001 | 000000000000000000000000000000000000001111111111111111111111111 |
| 011010 | 000000000000000000000000000000000000011111111111111111111111111 |
| 011011 | 000000000000000000000000000000000000111111111111111111111111111 |
| 011100 | 000000000000000000000000000000000001111111111111111111111111111 |
| 011101 | 000000000000000000000000000000000011111111111111111111111111111 |
| 011110 | 000000000000000000000000000000000111111111111111111111111111111 |
| 011111 | 000000000000000000000000000000001111111111111111111111111111111 |
| 100000 | 000000000000000000000000000000011111111111111111111111111111111 |
| 100001 | 000000000000000000000000000000111111111111111111111111111111111 |
| 100010 | 000000000000000000000000000001111111111111111111111111111111111 |
| 100011 | 000000000000000000000000000011111111111111111111111111111111111 |
| 100100 | 000000000000000000000000000111111111111111111111111111111111111 |
| 100101 | 000000000000000000000000001111111111111111111111111111111111111 |
| 100110 | 000000000000000000000000011111111111111111111111111111111111111 |
| 100111 | 000000000000000000000000111111111111111111111111111111111111111 |
| 101000 | 000000000000000000000001111111111111111111111111111111111111111 |

Fig. 4b

| | |
|---|---|
| 101001 | 000000000000000000000001111111111111111111111111111111111111 |
| 101010 | 000000000000000000000011111111111111111111111111111111111111 |
| 101011 | 000000000000000000000111111111111111111111111111111111111111 |
| 101100 | 000000000000000000001111111111111111111111111111111111111111 |
| 101101 | 000000000000000000011111111111111111111111111111111111111111 |
| 101110 | 000000000000000000111111111111111111111111111111111111111111 |
| 101111 | 000000000000000001111111111111111111111111111111111111111111 |
| 110000 | 000000000000000011111111111111111111111111111111111111111111 |
| 110001 | 000000000000000111111111111111111111111111111111111111111111 |
| 110010 | 000000000000001111111111111111111111111111111111111111111111 |
| 110011 | 000000000000011111111111111111111111111111111111111111111111 |
| 110100 | 000000000000111111111111111111111111111111111111111111111111 |
| 110101 | 000000000001111111111111111111111111111111111111111111111111 |
| 110110 | 000000000011111111111111111111111111111111111111111111111111 |
| 110111 | 000000000111111111111111111111111111111111111111111111111111 |
| 111000 | 000000001111111111111111111111111111111111111111111111111111 |
| 111001 | 000000011111111111111111111111111111111111111111111111111111 |
| 111010 | 000000111111111111111111111111111111111111111111111111111111 |
| 111011 | 000001111111111111111111111111111111111111111111111111111111 |
| 111100 | 000011111111111111111111111111111111111111111111111111111111 |
| 111101 | 000111111111111111111111111111111111111111111111111111111111 |
| 111110 | 011111111111111111111111111111111111111111111111111111111111 |
| 111111 | 111111111111111111111111111111111111111111111111111111111111 |

BINARY TO UNARY DECODER FOR A VIDEO DIGITAL TO ANALOG CONVERTER

BACKGROUND OF THE INVENTION

The present invention relates to a binary to unary decoder and, more particularly, to a binary to unary decoder for a video digital to analog converter which is cascadeable in both a horizontal and a vertical direction.

In a typical graphics display system for a personal computer, a digital video signal is retrieved from a memory array and converted into an analog video signal by a digital to analog converter which is then displayed on a video screen. In order to achieve an adequate number of color intensity levels, typically 8 bits of data are associated with each pixel on the screen which allows for up to 256 different colors. Eight bits of data originating from either bit plane registers or directly from RAM contained within the system are transmitted to a color look-up table. The color look-up table recognized the 8 bits of data as an 8-bit address which is used to select 1 of 256 24-bit color values. Each 24-bit color value comprises three 8-bit binary values which are converted to red, green and blue analog signals respectively which are then output to video display devices.

Many prior art video digital-to-analog converter (DACs) use a binary weighted decode scheme. A plurality of analog current generators are implemented, the size of which are proportional to the significance of the bits of the color value the generator represents. Preferably, 8 analog generators are required for each DAC. However, there is a problem with the binary weighted decode schemes in that there is sometimes a time discrepancy between when a certain color bit turns off and the next color bit turns on. Overlaps of color bits can cause a glitch in the video display which is apparent to the human eye. For example, if the color bit scheme is 100 and then the next color bit scheme is 011, sometimes the decoder mistakenly identifies the signal as 111. If a number of glitches are apparent on the video display, it produces an unpleasant visual appearance.

These disadvantages can be overcome by first converting the 8-bit binary color value to a unary value which is then converted to an analog signal. The analog signal is used to drive a plurality of analog generators which are each equal in size, thereby, eliminating the need for weighted generators. A binary to unary decoder receives a binary input value which represents a particular color value and which is converted into a unary output value which is then transmitted to the video DAC for conversion to an analog signal. In general, in an n-bit binary to unary decoder, there are $2^{n}-1$ unary outputs. The number of active unary outputs is equal to the binary input value. In the preferred embodiment, each color binary input value comprises 8 bits. Therefore in an 8-bit binary to unary decoder, there are $2^{8}-1$ or 256 unary outputs. If the binary input value equals 00000011, then there are 3 active unary outputs. The number of bits which are enabled by the unary decoder determines the number of active analog current generators and therefore the intensity of each color produced on the video display.

SUMMARY OF THE INVENTION

Briefly stated, the present invention comprises a binary to unary decoder for a video digital to analog converter which is cascadeable in both a horizontal and a vertical direction. The decoder comprises video data means for transmitting video data from a video data source. The video data comprises a predetermined number of binary input bits. A plurality of unary decoders receive the video data and convert the video data to a corresponding number of unary digits having comparable value. The unary decoders are arranged in a number of cascaded levels. The number of levels of cascaded unary decoders is related to the number of binary bits received by the following relationship:

$$N = [x/D]$$

wherein N = the number of levels of unary decoders;
x = the total number of binary bits;
D = the number of binary bits contained within a single unary decoder; and
[ ] = greatest integer number.

A plurality of cascaded unary block drivers receive the unary digits and transmit unary output digits to a video data bus. The plurality of unary block drivers are arranged in a number of tiers having a predetermined number of individual unary block drivers. The number of unary block drivers in each tier is determined by the following relationship:

$$U_t = 2^{dt} \text{ for } t = 1 \text{ to } (N-1)$$

wherein $U_t$ = the number of individual unary block drivers in a given tier;
$2^d$ = the number of unary digits in an individual unary block driver which is less than or equal to $2^D$; and
t = particular tier.

Activating means activates a predetermined number of cascaded unary block drivers corresponding to the numerical value of the video data.

BRIEF DESCRIPTION OF THE DRAWINGS

The foregoing summary, as well as the following detailed description, will be better understood when read in conjunction with the appended drawings. For the purpose of illustrating the invention, embodiments which are presently preferred are shown in the drawings. It is understood, however, that this invention is not limited to the perceived arrangements and instrumentalities shown.

In the drawings:

FIG. 2 is a schematic diagram of a unary block driver contained within the binary to unary decoder of FIG. 1;

FIGS. 4*a* and 4*b* are a chart of a conversion table of the binary input to the corresponding unary output for the binary to unary decoder of FIG. 1.

DESCRIPTION OF PREFERRED EMBODIMENT

Figure 1:
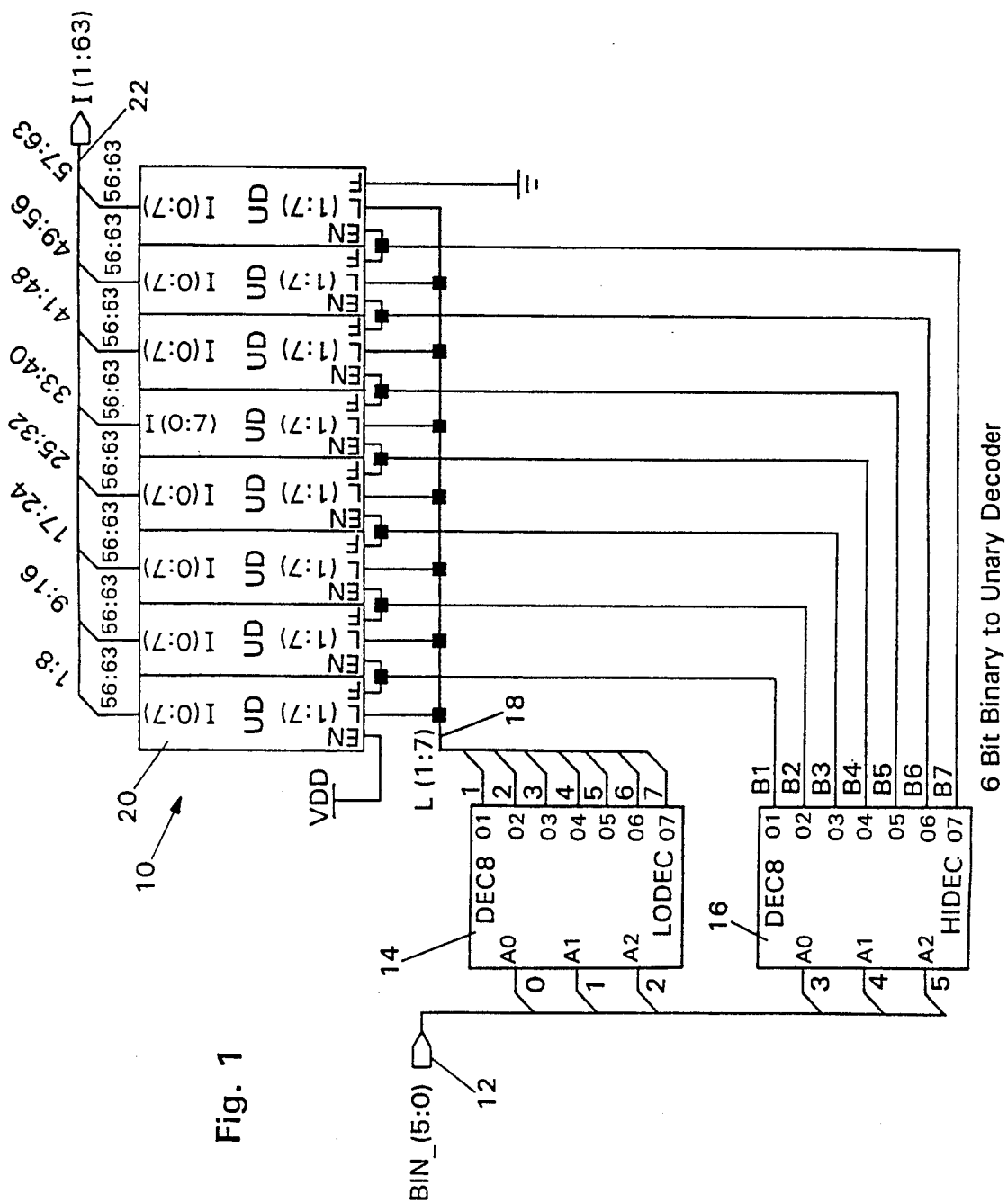
FIG. 1 is a schematic diagram of a 6 bit binary to unary decoder in accordance with the present invention.

Referring to the drawings in detail, wherein like numerals indicate like elements throughout, there is shown in FIG. 1 a first preferred embodiment of a binary to unary decoder 10 for a video digital to analog converter (DAC) in accordance with the present invention. The binary to unary decoder 10 represents a decoder for a 6 bit binary number. It is to be understood by those skilled in the art that any number of binary bits may be decoded using the concepts of the present invention without departing from the scope and spirit of the present invention.

A binary video input signal is received by a binary video input 12 which is capable of receiving up to 6 binary bits of video data at one time. The three least significant bits (LSB) of data are received by a first unary decoder 14. The three most significant bits (MSB) of data are received by a second unary decoder 16. The first and second unary decoders 14, 16 receive the binary bits and convert the binary bits to unary digits of a comparable value. The unary decoders 14, 16 operate in a conventional manner and as such will not be described in detail. In the preferred embodiment, each unary decoder decodes three binary bits of data. However, it is to be understood by those skilled in the art that any number of binary bits can be decoded by each individual unary decoder without departing from the scope and spirit of the present invention.

Each unary digit from the LSB unary decoder 14 is transmitted by a line bus 18 to a plurality of unary block drivers 20. The unary block drivers 20 are arranged in parallel and are capable of decoding up to the maximum number of unary digits transmitted from the unary decoders 14, 16. In the preferred embodiment, 8 unary block drivers 20 are placed in parallel and each unary decoder 20 is capable of decoding up to 8 unary digits allowing for a total of 64 unary output digits. A direct relationship exists between the number of unary digits transmitted from the LSB unary decoder 14 and the number of digits decoded by a unary block driver 20. For example, if 4 unary digits are transmitted from the LSB unary decoder 14, and no unary digits are transmitted from the MSB unary decoder 16, the first four digits of the first unary block driver 20 are activated.

The unary digits of the MSB unary decoder 16 are each transmitted on a separate bus line to an individual unary block driver 20. Each bus line activates an enable signal in a designated unary block driver 20 which activates the entire unary block driver. Each enable signal is coupled to a force signal such that each preceding unary block driver is also enabled. For example, if the first two unary bits of the MSB binary decoder 16 are activated, the second unary bit transmits an enable signal via bus line B2 to the third unary block driver. At the same time, a force signal is transmitted to the second unary block driver which is also activated. The first unary bit transmits an enable signal on line B1 to the second unary block driver and at the same time transmits a force signal to the first unary block driver. As a result, the first three unary block drivers are activated and all 24 unary bits are decoded. The decoded unary bits are transmitted by a video bus 22 to an analog current generator (not shown) which activates a particular video signal at a particular intensity as determined by the unary code.

Referring to FIGS. 4a and 4b, there is shown a chart depicting the conversion values for each 6 bit binary number to its equivalent 64 bit unary number. As can be seen, each digit position of the 64 bit unary number has a value of zero where the number "0" appears and a value of one where a "1" appears. Therefore binary 111111 which has a decimal value of 64 has a unary value of 64 "1" digits as seen in FIG. 4b. Likewise binary 000100 which has a decimal value of 4, has a unary value of four "1's" in the 4 LSB and sixty leading "0's".

Referring specifically to FIG. 2, there is shown a schematic diagram of a unary block driver in accordance with the present invention. The line data bus 18 carries unary digits from the LSB unary decoder 14 and transmits them to an individual unary block driver 26. Each individual block driver 26 may receive an LSB signal from bus line 18, the signal being either an enable signal or a force signal. Each unary digit which is activated by an enabled signal, in turn transmits a force signal to all lesser significant unary digits in order to enable these unary digits as well. An individual unary block driver 26 may either be totally enabled or partially enabled by transmitting a number of unary digits less than those contained with the individual unary block driver 26.

For example, if the third unary digit was transmitted by the line data bus 18 to the fourth individual unary block driver 26, an enabled signal would be transmitted to the fourth individual unary block driver 26 causing it to be asserted. The fourth individual unary block driver 26 would in turn transmit a force signal to the third individual unary block driver 26. The third individual unary block driver 26 would transmit a force signal to the second individual unary block driver 26 and the second individual unary block driver 26 would transmit a force signal to the first individual unary block driver 26. As a result, all four LSB unary block drivers would be asserted.

Figure 3A:
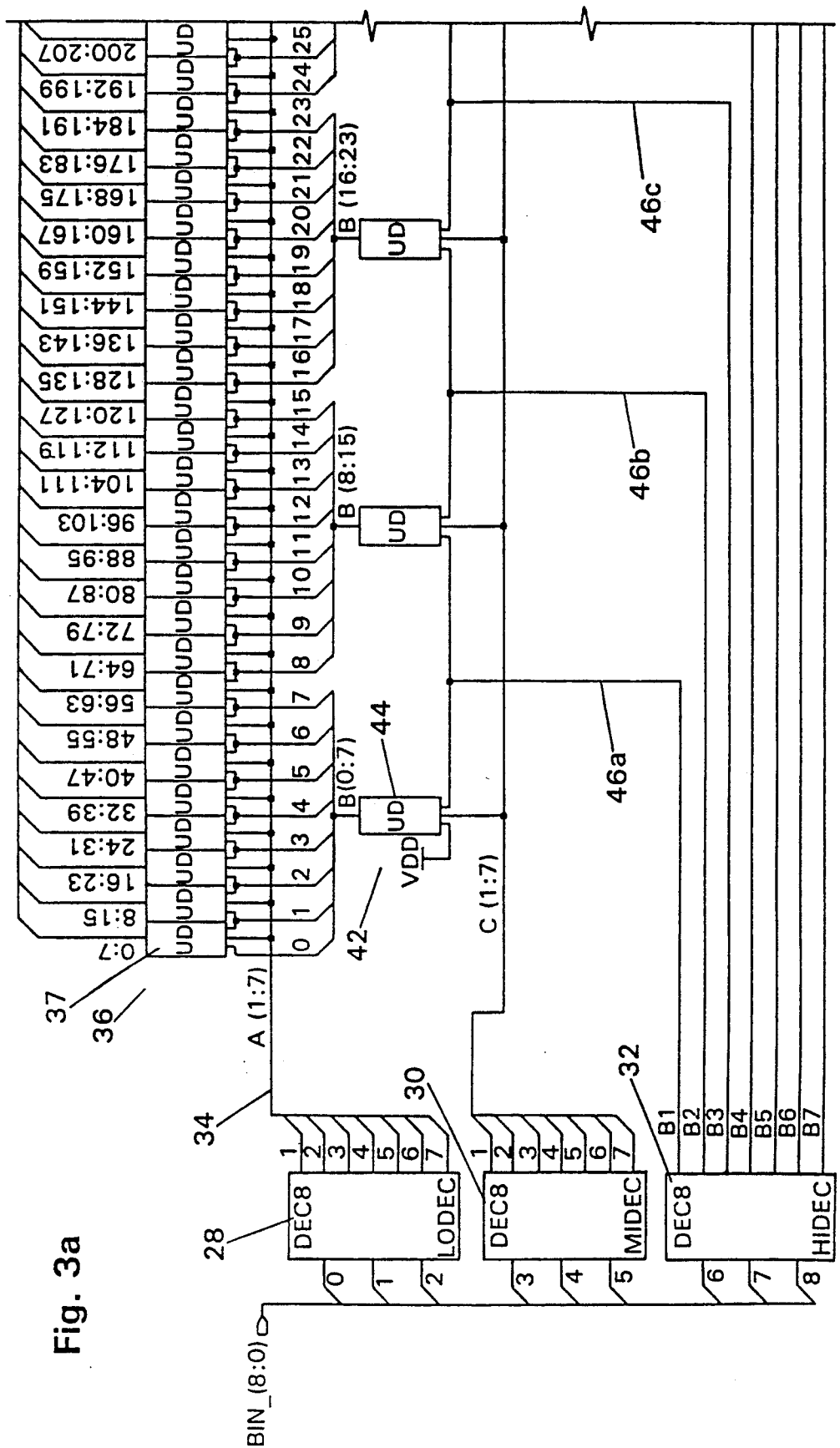
FIGS. 3A and 3B are schematic diagrams of an alternative embodiment of a 9 bit binary to unary decoder.
Figure 3B:
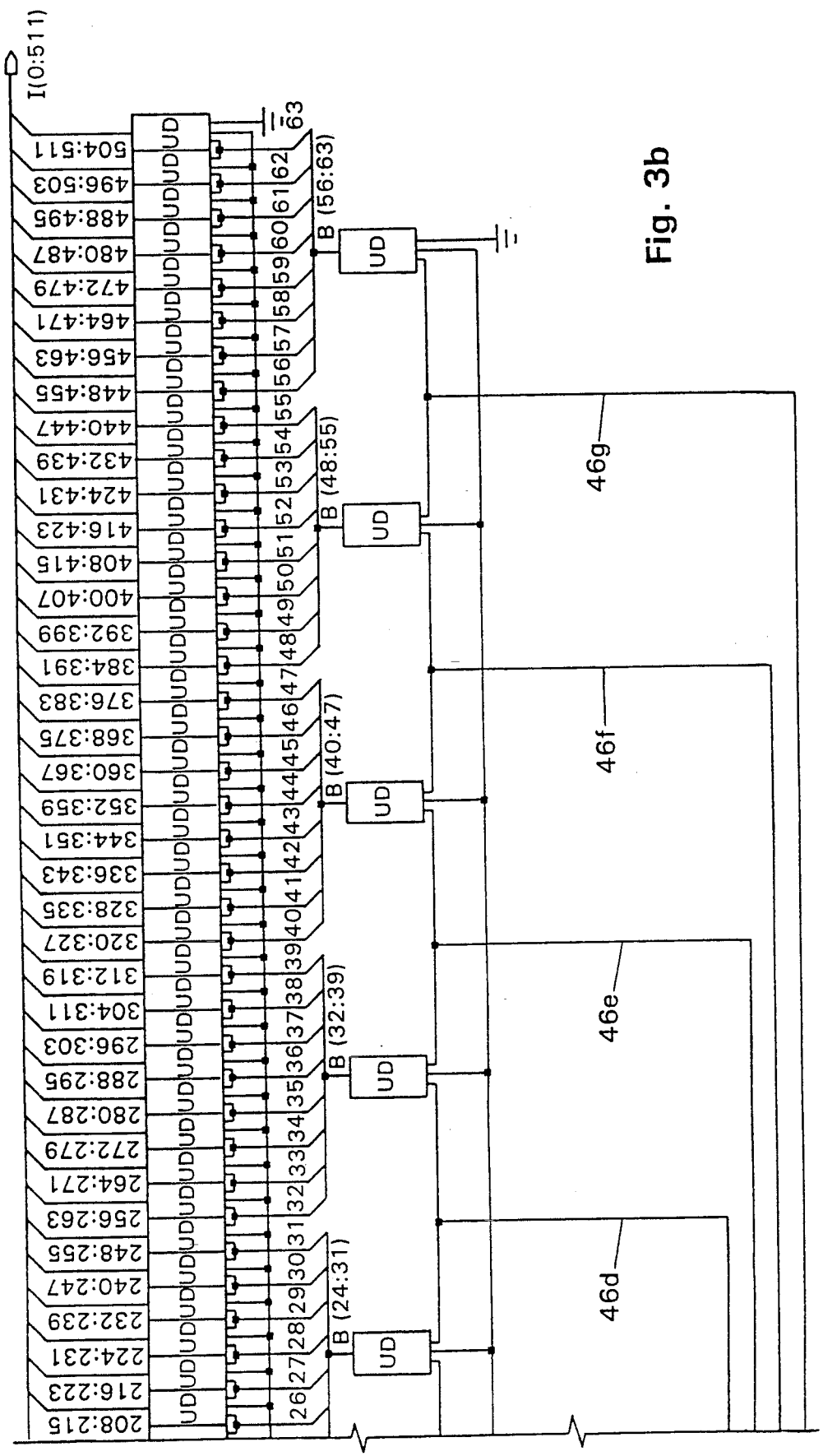

Referring to FIG. 3, there is shown a schematic diagram of a 9 bit binary to unary decoder in accordance with the present invention. Unlike the 6 bit binary to unary decoder of FIG. 1, the 9 bit binary to unary decoder is capable of decoding 9 binary bits to 512 unary digits. The 9 bit binary to unary decoder is cascaded in both a horizontal and a vertical direction. A binary video input signal is received by the binary video input 12 which is capable of receiving up to 9 binary bits of video data at one time. The three LSB of video data are received by a first unary decoder 28. The three middle significant bits of video data are received by a second unary decoder 30. The three MSB of video data are received by a third unary decoder 32. Each unary decoder receives its respective binary bits and converts the binary bits to unary digits of a comparable value. In the present invention since each unary decoder receives three binary bits of video data, eight unary digits of video data are outputted.

The third unary decoder 32 transmits its decoded unary digits by a plurality of line buses 46a–46g. Each line bus asserts at least one complete individual unary block driver 44 located within a first tier of unary block drivers 42. For example, if the second unary digit from the third unary decoder 32 is transmitted by line bus 46b to the third individual unary block driver 44 located within the first tier of unary block drivers 42, the third unary block driver 44 transmits a force signal to the first unary block driver located within the second tier of unary block drivers 42 which in turn transmits a force signal to the first unary block driver located within the first tier of unary block drivers. At the same time, the third unary block driver located within the first tier of unary block drivers activates the block of unary block drivers 37 in a second tier of unary block drivers 36 which are numbered from 16 to 23. These in turn transmit force signals which automatically activate all the individual unary block drivers 37 within the second tier of unary block drivers 36 which extend from zero to 23.

The second unary decoder 30 transmits unary digits via a second line bus to the first tier of unary block drivers 42 which contain a plurality of individual unary block drivers 44. In the preferred embodiment, the first tier of unary block drivers 42 comprises 8 individual unary block drivers 44. Each unary digit from the LSB unary decoder 28 is transmitted by a line bus 34 to the second tier of unary block drivers 36. The unary digits from the first binary decoder 28 may activate either a portion of an individual unary block driver 37 or an entire unary block driver. In the preferred embodiment, the second tier of unary block drivers 36 contains 64 individual unary block drivers 38. In the preferred embodiment, each individual unary block driver 36 is capable of containing up to 8 unary digits.

In the preferred embodiment, each individual unary block driver 44 can preferably contain up to 8 unary digits. The second unary decoder 30 is capable of asserting either a portion of an individual unary block driver 44 or the entire unary block driver 44. The first tier of unary block drivers 42 in turn automatically asserts a predetermined block of individual unary block drivers 37 in the second tier of unary block drivers 36. In a preferred embodiment, each individual unary block driver 44 in the first tier of unary block drivers 42 asserts a block of 8 individual unary block drivers 37 in the second tier of unary block drivers 36. The second unary decoder 30 automatically asserts at least one entire block of individual unary block drivers 37 in the second tier of unary block drivers 36 when the unary digits from the second unary decoder 30 are transmitted to the first tier of unary block drivers 42.

The block of individual unary block drivers 37 in the second tier of unary block drivers 36 is enabled by a force signal and enable arrangement similar to that described in FIG. 1. Therefore, for each individual unary block driver 44 asserted in the first tier of unary block drivers 42, all preceding unary block drivers are automatically asserted by the force signal. Likewise, each block of individual unary block drivers 37 in the first tier of unary block drivers 36 which are activated by the second unary decoder 30 automatically assert all preceding blocks of unary block drivers by a force signal.

It is to be understood by those skilled in the art that any cascaded arrangement of binary to unary decoders can be made based on the number of binary bits being decoded.

In determining the cascaded arrangement, a determination must first be made of how many binary bits are to be decoded. The following several equations determines the number of levels required for a binary to unary decoder:

$$N = [x/D]$$

wherein N = the number of levels of unary decoders;
x = the total number of binary bits to be decoded;
D = number of binary bits contained within a single unary decoder; and
[ ] = greatest integer number.

For example, FIG. 3 illustrates a 9 bit binary to unary decoder. Applying the above-defined equation, in the given example, the total number of binary bits to be decoded is 9 and in the preferred embodiment the number of binary bits in a single unary decoder is 3. Applying the appropriate values into equation (1):

$$N = [9/3]$$
$$= 3$$

Therefore, 3 levels of unary decoders are required in order to produce a 9 bit binary to unary decoder in accordance with the present invention. The number of tiers of unary block drivers is determined by the following equation:

$$T = N - 1 \qquad (2)$$

wherein T = the total number of tiers
N = the number of levels of unary decoders.

In the present example, the number of tiers of unary block drivers would be:

$$T = 3 - 1 = 2$$

To determine the number of individual unary block drivers within each tier, the following equation is applied:

$$U_t = 2^{dt} \text{ for } t = 1 \text{ to } (N-1)$$

wherein $U_t$ = the number of individual unary block drivers in a given tier;
$2^d$ = the number of unary bits in an individual block driver and is less than or equal to $2^D$; and
t = particular tier.

In the preferred embodiment, there are 8 unary digits per unary decoder, therefore $2^d = 8$. In the given example, the first tier of unary block drivers 36 is determined by the following:

$$U_1 = 8^{(1)} = 8,$$

Therefore 8 unary block drivers are required in the first tier of unary block drivers 42. In the second tier, $$U_2 = 8^{(2)} = 64,$$

Therefore there are 64 unary block drivers in the second tier of unary block drivers 36.

From the foregoing description, it can be seen that the present invention comprises a binary to unary decoder for video digital to analog converter. It will be appreciated by those skilled in the art that changes could be made to the embodiment described above without departing from the broad inventive concept thereof. It is understood, therefore, that this invention is not limited to the particular embodiment disclosed, but it is intended to cover all modifications which are within the scope and spirit of the invention as defined by the appended claims.

I claim:
1. A binary to unary decoder for a video digital to analog converter which is cascadeable in both a horizontal and a vertical direction, the decoder comprising:
video data means for transmitting video data from a video data source, said video data comprising a predetermined number of binary input bits;
a plurality of unary decoders for receiving said video data and converting said video data to a corresponding number of unary digits having comparable value, said unary decoders being arranged in a number of cascaded levels, the number of levels of cascaded unary decoders being related to the number of binary input bits received in the following relationship:

$$N = [x/D]$$

wherein N = the number of levels of unary decoders
x = the total number of binary input bits;
D = number of binary input bits contained within a single unary decoder;
[ ] = greatest integer number;
a plurality of cascaded unary block drivers for receiving the unary digits and transmitting unary output digits to a video data bus, the plurality of unary block drivers being arranged in a number of tiers having a predetermined number of individual unary block drivers, the number of unary block drivers in each tier being determined by the following relationship:

$$U_t = 2^{dt} \text{ for } t = 1 \text{ to } (N-1)$$

wherein $U_t$ = the number of individual unary block drivers in a given tier;
$2^d$ = the number of unary digits in an individual unary block driver which is less than or equal to $2^D$;
t = particular tier; and
activating means for activating a predetermined number of cascaded unary block drivers corresponding to the numerical value of the video data.

2. The binary to unary decoder according to claim 1, wherein each said unary decoder receives up to 3 binary input bits at a time.

3. The binary to unary decoder according to claim 1, wherein each said cascaded unary block driver receives up to 8 unary digits.

4. The binary to unary decoder according to claim 1, further comprising enabling means for enabling the unary digits to be transmitted through the unary block driver unmodified to the video data bus, and
forcing means for forcing all of the unary output digits of an individual unary block driver to a high state.

5. A binary to unary decoder which is cascadeable in both a horizontal and a vertical direction comprises:
data means for transmitting data from a data source, said data means comprising a predetermined number of binary input bits;
a plurality of unary decoders for receiving said data and converting said data to a corresponding number of unary digits having comparable value, said unary decoders being arranged in a number of cascaded levels, the number of levels of cascaded unary decoders being related to the number of binary bits receives in the following relationship:

$$N = [X/D]$$

wherein N = the number of levels of unary decoders
x = the total number of binary bits;
D = number of binary bits contained within a single unary decoder;
[ ] = greatest integer number;
a plurality of cascaded unary block drivers for receiving the unary digits and transmitting the unary output digits to a data bus, the plurality of unary block drivers being arranged in a number of tiers having a predetermined number of individual unary block drivers, the number of unary block drivers in each tier being determined by the following relationship:

$$U_t = 2^{dt} \text{ for } t = 1 \text{ to } (N-1)$$

wherein $U_t$ = the number of individual unary block drivers in a given tier;
$2^d$ = the number of unary digits in an individual unary block driver which is less than or equal to $2^D$; and
t 32 particular tier;
enabling means for enabling the unary digits to be transmitted through the unary block driver unmodified to the databus; and
forcing means for forcing all of the unary output digits of an individual unary block driver to a high state.

6. The binary to unary decoder according to claim 5, wherein each said unary decoder receives up to 3 binary input bits at a time.

7. The binary to unary decoder according to claim 5, wherein each said cascaded unary block driver receives up to 8 unary digits.

8. The binary to unary decoder according to claim 5, wherein the data are video data.

* * * * *